(12) United States Patent
Yang et al.

(10) Patent No.: US 7,477,959 B2
(45) Date of Patent: Jan. 13, 2009

(54) PHOTORESIST SYSTEM

(75) Inventors: Yenni Yang, Taichung (TW); Fu-Kai Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 568 days.

(21) Appl. No.: 10/180,352

(22) Filed: Jun. 26, 2002

(65) Prior Publication Data

US 2004/0002773 A1    Jan. 1, 2004

(51) Int. Cl.
*G06F 19/00* (2006.01)
(52) U.S. Cl. ...................... 700/108; 700/115
(58) Field of Classification Search ......... 700/115–117, 700/121, 109–110, 224–227
See application file for complete search history.

(56) References Cited

U.S. PATENT DOCUMENTS

| | | | | |
|---|---|---|---|---|
| 5,828,989 A * | 10/1998 | Zvonar et al. | ............... | 702/188 |
| 6,136,614 A * | 10/2000 | Funk | ............... | 438/5 |
| 6,484,113 B1 * | 11/2002 | Tsai et al. | ............... | 702/84 |
| 6,671,569 B1 * | 12/2003 | Schoop et al. | ............... | 700/112 |
| 6,819,968 B1 * | 11/2004 | Funk | ............... | 700/121 |
| 6,879,876 B2 * | 4/2005 | O'Dougherty et al. | ...... | 700/231 |
| 6,895,294 B2 * | 5/2005 | Mautz et al. | ................ | 700/121 |
| 7,276,675 B2 * | 10/2007 | Faries et al. | ................ | 219/413 |
| 2005/0177274 A1 * | 8/2005 | O'Dougherty et al. | ...... | 700/231 |

FOREIGN PATENT DOCUMENTS

WO       WO 01/82009 A2 * 11/2001

* cited by examiner

*Primary Examiner*—Zoila E Cabrera
(74) *Attorney, Agent, or Firm*—Tung & Associates

(57) ABSTRACT

A photoresist system is disclosed. A graphical user interface of the system allows an operator to initiate a bottle switching operation, among other operations. Barcode data of a photoresist bottle is obtained by an equipment server from a controller. Photoresist data relating to the bottle is obtained by the equipment server from a database through a constraint server. The equipment server, preferably with assistance from the constraint server, determines whether the bottle contains appropriate photoresist for the semiconductor processing to be performed on semiconductor wafers. If the bottle contains appropriate photoresist, the equipment server, through the constraint server, stores the expiration date of the bottle and the batch identifier of the bottle, as indicated by the barcode data, in the database. If the bottle contains inappropriate photoresist, then the system acts to prevent the semiconductor processing of the semiconductor wafers with the inappropriate photoresist contained in the bottle.

19 Claims, 6 Drawing Sheets

FIG 2

| BARCODE | EACH POSITION CODE RULE AND DESCRIPTION | | | |
|---|---|---|---|---|
| | 1ST CODE | 2ND-10TH CODE | 11TH-18TH CODE | 19TH-20TH CODE |
| THE 1ST STRIP | BARCODE: THE FIRST STRIP IS "1" | PHOTO RESIST MATERIAL NUMBER: 7 CODES + 2 BLANKS | PHOTO RESIST EXPIRATION DATE: YYYYMMDD | COMPANY ABBREVIATION |
| | 1ST CODE | 2ND-15TH CODE | | 16TH-20TH CODE |
| THE 2ND STRIP | BARCODE: THE 2ND STRIP IS "2" | PHOTO RESIST BATCH ID + BLANKS (UP TO 14 CODES) | | PHOTO RESIST MANUFACTURING FLOW NUMBER (SAME PHOTO RESIST AND SAME BATCH, EACH PHOTO RESIST BOTTLE FLOW NUMBER MUST BE DIFFERENT) |
| | 1ST CODE | 2ND-20TH CODE | | |
| THE 3RD STRIP | BARCODE: THE 3RD STRIP IS "3" | 6 CODES OF PHOTO RESIST LIQUID MANUFACTURER'S NUMBER | | |

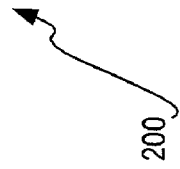

PHOTORESIST SYSTEM

FIELD OF THE INVENTION

This invention relates generally to semiconductor fabrication, and more particularly to the photolithography that may be performed during such fabrication.

BACKGROUND OF THE INVENTION

Photoresist is the light-sensitive film typically spun onto semiconductor wafers and exposed using high-intensity light through a photomask. The exposed photoresist (or the unexposed photoresist, depending on the polarity of the resist) is dissolved with developers, leaving a pattern of photoresist that allows etching to take place in some areas of the wafer, while preventing it in other areas of the wafer. Thus, photoresist is used in semiconductor fabrication primarily in the lithography or photolithography stages. Lithography itself generally is the process of pattern transfer.

Photoresist comes in different types, for different applications. For example, photoresist may be positive or negative photoresist, which generally indicates its amenability to being developed after exposure to light. Photoresist may be differently selective to different wavelengths of light as well. Resist may also expire, such that it has an expiration date after which it should not be used.

During the fabrication of semiconductor devices onto semiconductor wafers, it has generally been up to the technician or operator of the fabrication equipment to ensure that the proper bottle of photoresist is loaded for a given job. Mistakes made during photoresist switching, although quite rare (happening only three or four times a year, for instance), are quite catastrophic. If the wrong type of photoresist is loaded, or if an expired bottle of photoresist is used, a large number of semiconductor wafers may become ruined before the mistake is noticed. This can result in a large amount of financial loss to the fabrication foundry, as well as loss of goodwill from the customer.

For these and other reasons, therefore, there is a need for the present invention.

SUMMARY OF THE INVENTION

The invention relates to a photoresist system. A graphical user interface of the system allows an operator to initiate a bottle switching operation, among other operations. Barcode data of a photoresist bottle is obtained by an equipment server from a controller. Photoresist data relating to the bottle as indicated by the barcode data is obtained by the equipment server from a database through a constraint server. The equipment server, preferably with assistance from the constraint server, determines whether the bottle contains appropriate photoresist for the semiconductor processing to be performed on semiconductor wafers, based on the photoresist data. If the bottle contains appropriate photoresist, the equipment server, through the constraint server, stores the expiration date of the bottle and the batch identifier of the bottle, as indicated by the barcode data, in the database. If the bottle contains inappropriate photoresist, then the system acts to prevent the semiconductor processing of the semiconductor wafers with the inappropriate photoresist contained in the bottle.

Embodiments of the invention provide for advantages not found within the prior art. Beneficially, improperly performed operations relating to switching photoresist bottles are detected, so that semiconductor wafers are not damaged, saving the semiconductor foundry money and customer goodwill. That is, if the wrong type of photoresist is inserted, or if an expired bottle of photoresist is inserted, the condition is detected, and the lithography process not allowed to continue until the condition is rectified. Preferably, the system saves all data relating to photoresist bottle switching operations that are performed, so that the utilization of photoresist can be analyzed. Such utilization analysis may allow for determination of whether the reasons for switching photoresist bottles were proper, and so on. Still other aspects, embodiments, and advantages of the invention will become apparent by reading the detailed description that follows, and by referring to the accompanying figures.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIG. 2 is a table showing how photoresist bottle barcodes can be defined, according to one embodiment of the invention.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
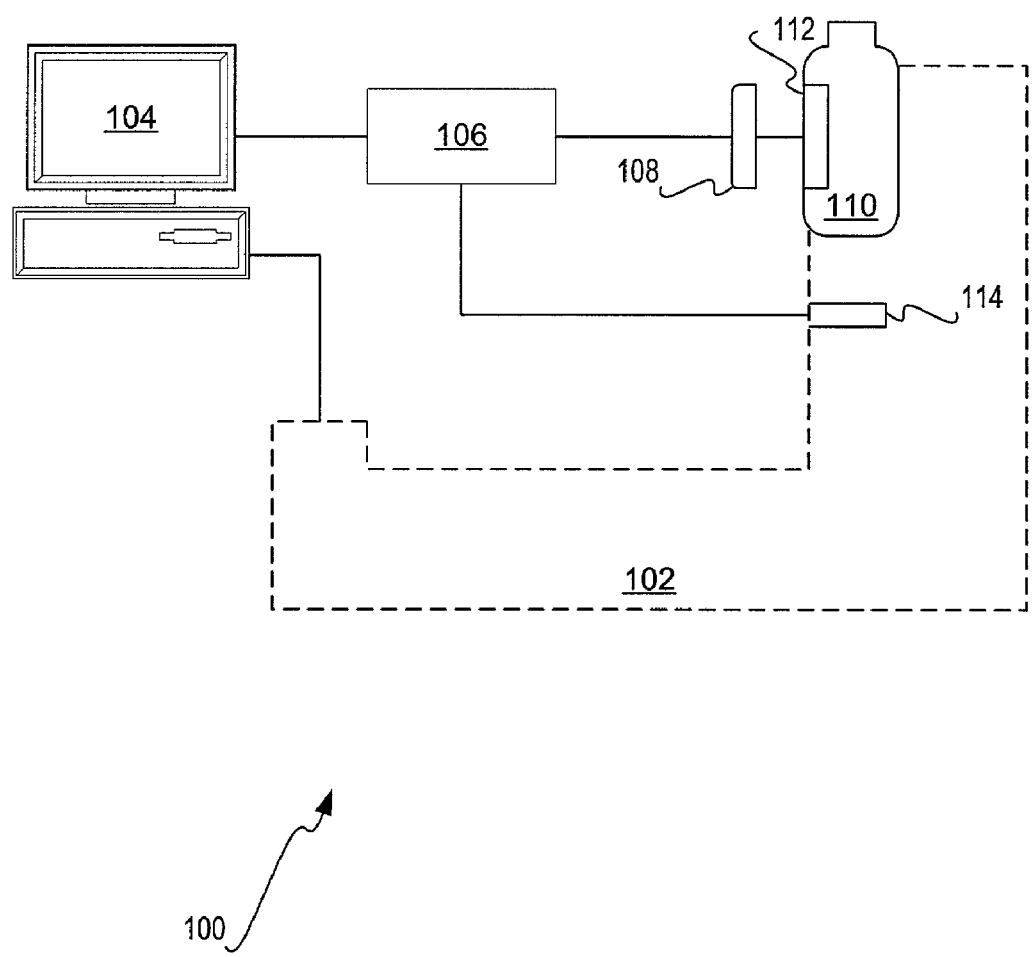
FIG. 1 is a diagram of a hardware system architecture, according to an embodiment of the invention.

FIG. 1 shows the hardware system architecture of an embodiment of the invention. The hardware system 100 includes a photo track 102, a fabrication computer 104, a controller 106, a barcode reader 108, and a bottle sensor 114. The photo track 102 is the lithography photoresist machine, which can transport and otherwise accept different bottles of photoresist (i.e., such that photoresist bottles can be loaded and unloaded via the photo track 102). Such bottles of photoresist include the photoresist bottle 110, which has a label with a barcode 112 thereon. The fabrication computer 104 acts as the main control component with the system 100. The fabrication computer 104 communicates with the controller 106 preferably via the Semiconductor Equipment Communication Standard 2 (SECSII), which is a standard known within the art. The computer 104 may in actuality be one or more computers, which may be configured in a client-server configuration or otherwise networked with one another.

The controller 106 is preferably a dedicated hardware controller that interacts with the barcode reader 108 and the bottle sensor 114, and communicates information received from the reader 108 and the sensor 114 to the computer 104. The barcode reader 108 specifically scans the barcode labels of photoresist bottles, such as the barcode label 112 of the photoresist bottle 110. The bottle sensor 114 detects whether a photoresist bottle, such as the bottle 110, has been picked up (i.e., removed) by the operator). The bottle sensor 114 in one embodiment operates on reflection theory, such that it detects the presence or absence of a bottle by sending a light or other signal. If the light or other signal is reflected back to the sensor 114, then this indicates either the presence or absence of the bottle.

There is no universal standard for barcodes for photoresist manufacturers. Therefore, preferably an arbitrary standard is defined and provided to photoresist manufacturers for labeling their photoresist bottles. This enables the barcode reader 108 to read the bar codes, and the computer 104 to interpret the bar codes properly. In one embodiment, the barcode is defined according to the table 200 of FIG. 2. However, as can be appreciated by those of ordinary skill within the art, the table 200 is only one example of a barcode standard, and the invention is not limited to the barcode standard delineated in the table 200.

Figure 3:
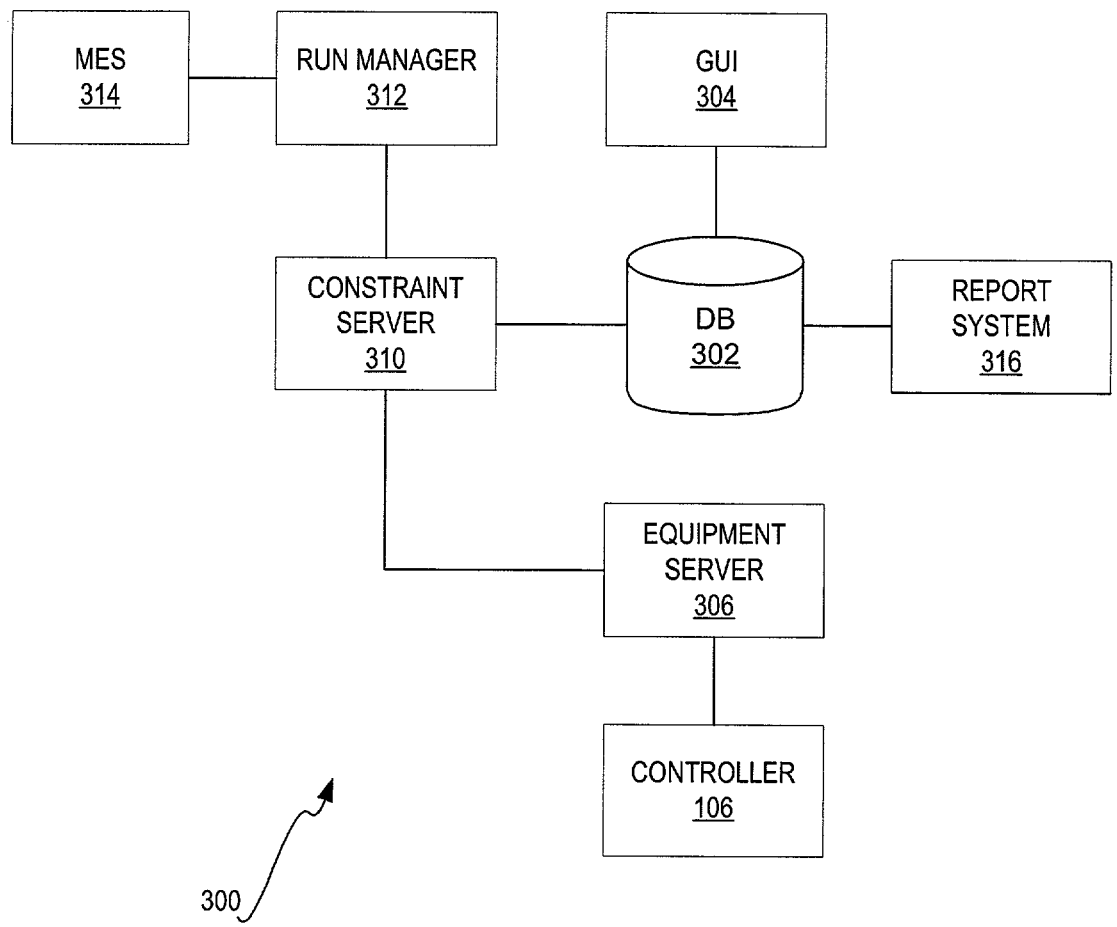
FIG. 3 is a diagram of a software system architecture, according to an embodiment of the invention.

FIG. 3 shows a software system architecture of an embodiment of the invention. The software system 300 is preferably implemented within the computer 104 of FIG. 1, except for the controller 106 indicated in FIG. 3, although the invention is not so limited. The software system 300 includes a database 302, a graphical user interface (GUI) 304, an equipment server 306, a constraint server 310, and a run manager 312. The system 300 may optionally include a manufacture execution system (MES) 314 and a report system 316. Each of these components can be implemented as a separate computer program or programs, as different modules or objects of the same program or programs, or as a combination of either approach. In one embodiment of the invention, the GUI 304, the equipment server 306, and the run manager 312 are run on a client or host part of a computer or computer system, whereas the constraint server 310, the report system 316, and the MES 314 are run on a server part of the computer or computer system.

The database 302 stores records of every operation activity performed within the system 300, such as those entered through the GUI 304. Thus, the production line is able to query each photoresist history record, and analyze the amount of photoresist utilized. The GUI 304 allows for a number of different operations. First, it allows a change photoresist type operation to set up or correct the photoresist type. It also provides for a change photoresist bottle to record the reasons for a photoresist change, as well as data related to bottle switching, into the database 302. When electricity is out or the system 300 is restarted, the operator then only needs to perform another operation, rescan all barcodes, and does not need to individually change the photoresist bottle. The MES 314 is to execute operations entered or initiated through the GUI 304.

The equipment server 306, the run manager 312, and the constraint server 310 act to prevent any improper operations relating to photoresist from occurring. That is, when any photoresist-related data indicates that expired photoresist may be used, or that the wrong type of photoresist may be used, then the photoresist machine is preferably not allowed to proceed. The equipment server 306 specifically is software that processes photoresist machine-related data received from the controller 106, and also processes data in the database 302 through the constraint server 310. The run manager 312 is middleware that links the equipment server 306 to the MES 314 through the constraint server 310. During receiving of production lots, it informs the constraint server 310 to check the status of the photoresist being used. The constraint server 310 assists the equipment server 306 to obtain photoresist data from the database 302, and assists the run manager 312 in checking the status of photoresist. Finally, the report system 316 extracts data from the database 302, so that, for instance, the operator can be informed of the current production line status of each photoresist machine, and be allowed to perform photoresist history data inquiries.

Figure 4:
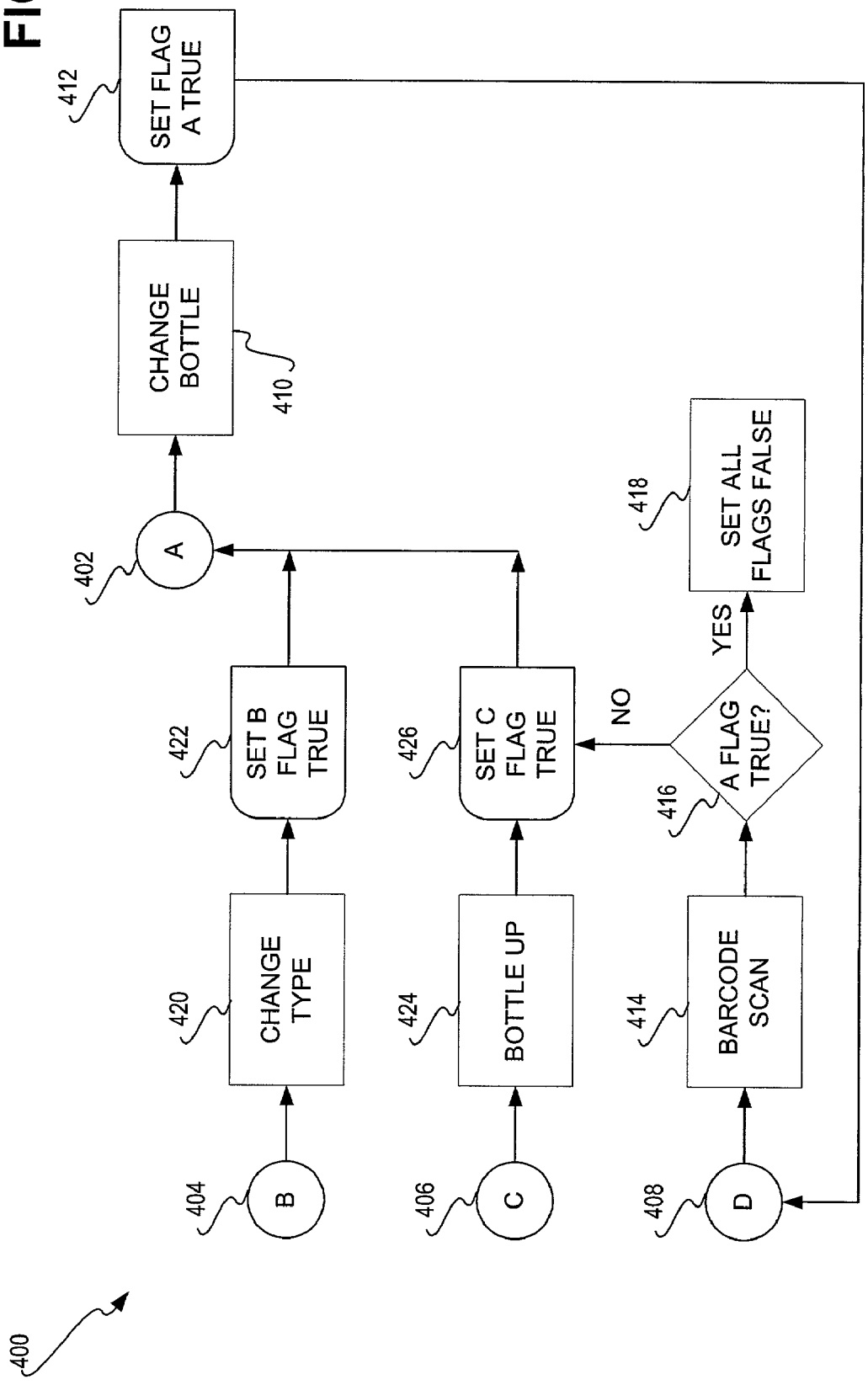
FIG. 4 is a state diagram showing how operation of an embodiment of the invention occurs.

FIG. 4 shows a state diagram 400 according to an embodiment of the invention that illustrates the type of operations that may be performed by the operator through the GUI 304, or that otherwise may be performed. The types of operations are operation A 402, operation B 404, operation C 406, and operation D 408. Operation A 402 relates to a bottle change 410, resulting in the A flag being set true (412). Operation D 408 is performed immediately thereafter, but can also be independently initiated if the user self-initiates a barcode scan. Thus, operation D 408 relates to a barcode scan 414. If the A flag is true (416), which only occurs if operation A 402 has previously been performed, then the A, B, and C flags are all set false (418), and the process is finished. Otherwise, the C flag is set true (426), and operation A 402 is begun.

Operation B 404 relates to a bottle type change 420, which sets the B flag as true (422), and necessarily results in a bottle change as the operation A 402, as has been described. Operation C 406 relates to a bottle up event 424 preferably detected through the equipment server 306, in which a photoresist bottle has been picked up for more than a predetermined length of time, such as fifteen seconds. When this occurs, then the C flag is set as true (426), and necessarily results in a bottle change as the operation A 402. Thus, the user can manually change the bottle (of the same or a different type as currently is being used) as the operation A 402, and manually change the bottle type as the operation B 404, which also requires a bottle change. The user may pick up a bottle for more than the predetermined length of time as the operation C 406, which is detected automatically and is assumed to result in a bottle change.

The user may also manually cause a bottle to be scanned, or manually scan a photoresist bottle, by independently invoking the operation D 408, which by performance of 426 concludes a bottle up condition when this condition is not otherwise automatically detected. Otherwise, the operation D 408 is invoked when a bottle is changed, from either operation A 402, operation B 404, or operation C 406. Thus, the operation B 404 and the operation C 406 necessarily result in performance of the operation A 402, and the operation D 408 concludes the operation C 406 has been performed and necessarily results in the performance of the operation A 402.

When the operators performs photoresist bottle switching, the equipment server 306, through the controller 106, obtains the barcode data on the photoresist bottle, and through the constraint server 310 obtains the photoresist data in the database 302. If the photoresist type does not match—i.e., if it is the incorrect type of photoresist that was loaded—then the bottle switching fails. If the checking result is correct and there is no error, however, then the bottle switching succeeds and the expiration date on the photoresist barcode and the batch identifier for the bottle is stored in the database.

Figure 5A:
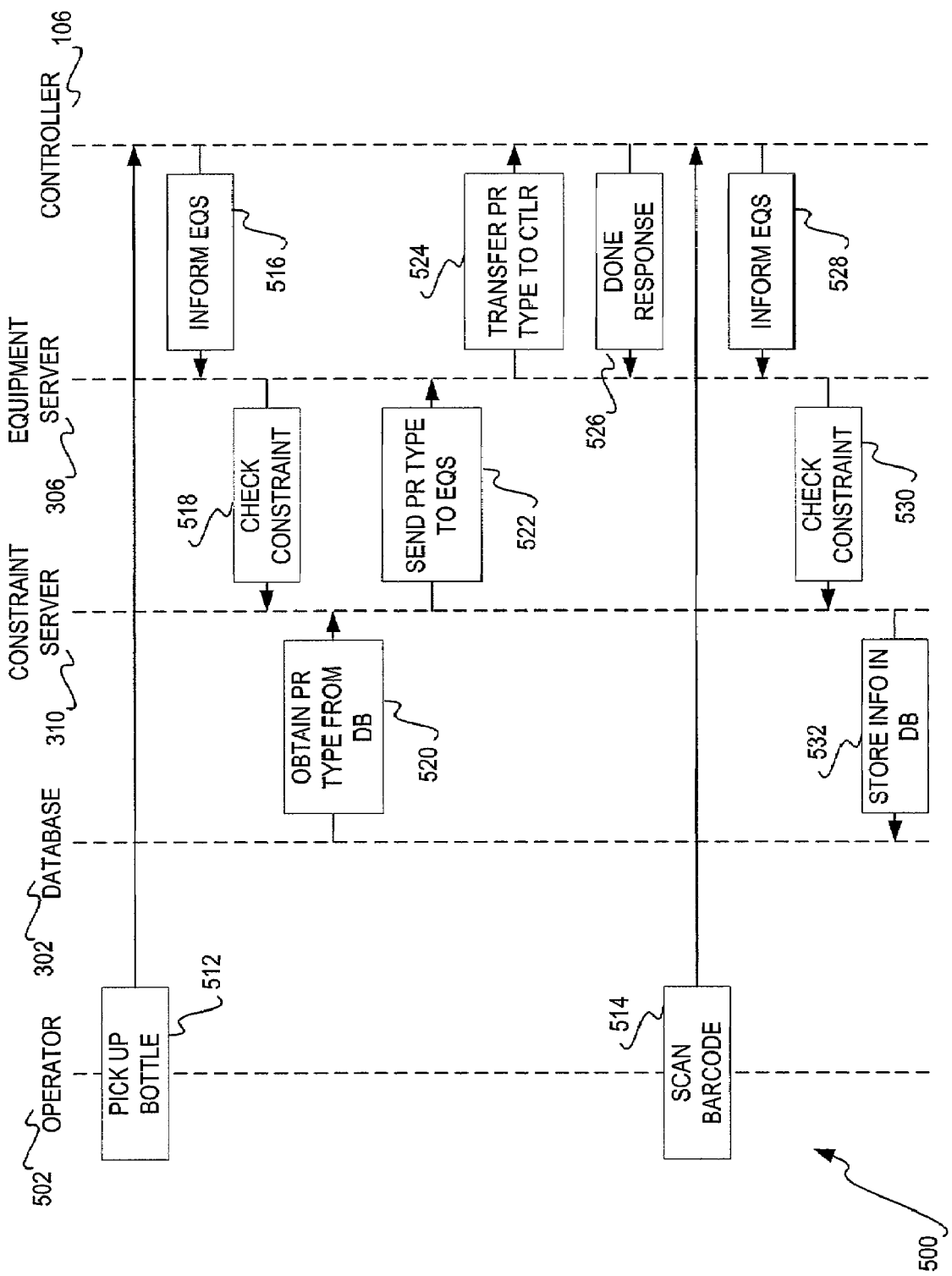
FIGS. 5A and 5B are flow diagrams showing how operation of an embodiment of the invention occurs.
Figure 5B:
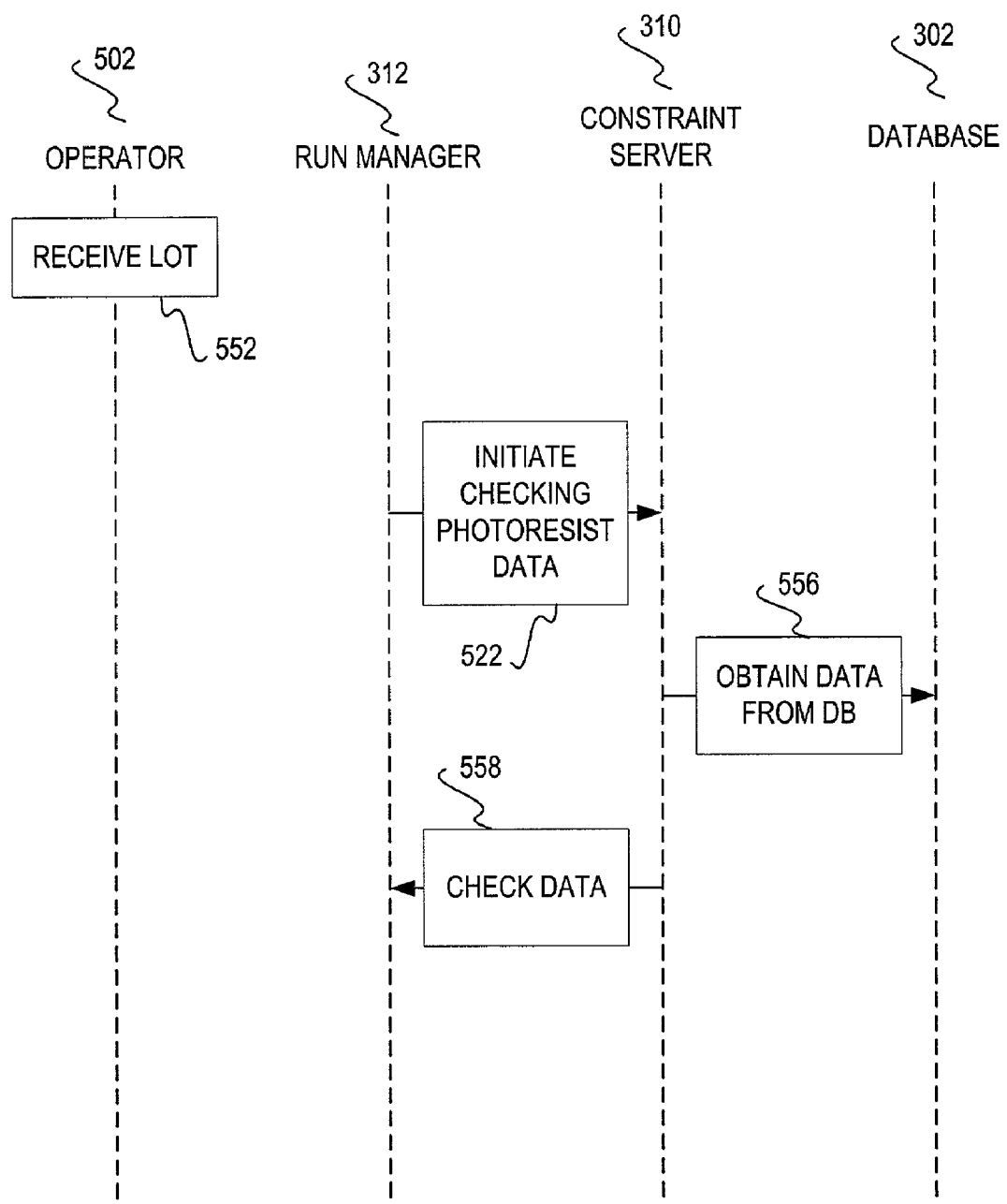

FIGS. 5A and 5B show illustratively this performance. In FIG. 5A, the operator 502 can begin a chain of events 500 by either picking up a photoresist bottle (512) for more than the predetermined length of time, such as fifteen seconds, or by manually scanning or causing to be scanned a barcode of a bottle (514). In the former instance, 516, 518, 520, 522, 524, 526, 528, 530, and 532 are performed among the database 302, the constraint server 310, the equipment server 306, and the controller 106. In the latter instance, 528, 530, and 532 are performed among these components.

Thus, after the operator 502 has picked up a photoresist bottle (512), the controller 106 informs the equipment server 306 that this event has occurred (516). The equipment server 306 checks constraints against the constraint server 310 (518), or otherwise requests that the constraint server 310 check these constraints. The constraint server 310 obtains the proper photoresist type from the database 302 (520) to assist or perform this determination, and sends this photoresist type to the equipment server (522). If any constraints are not met—i.e., the wrong type of photoresist is being used—then the process stops. Otherwise, the equipment server 306 transfers the photoresist type to the controller 106 (524), which responds when it has finished (526).

The controller 106 also informs the equipment server 306 when it has scanned the bar code of a bottle inserted (528), either after having finished (526), or in response to the operator 502 initiating such scanning (514). The equipment server 306 again checks the constraints against the constraint server 310 (530), or causes the constraint server 310 to check the constraints. As before, if any constraints are not met, then the process stops. The constraint server 310 then stores the information about the bottle just scanned in the database 302 (532).

In FIG. 5B, the operator 502 starts a chain of events 550 by receiving a photoresist lot (552). This causes the run manager 312 to initiate the checking of the photoresist data regarding the new lot with the constraint server 310 (554). To perform this checking, the constraint server 310 obtains the appropriate data from the database 302 (556). This allows the constraint server 310 to check the data and report the results back to the run manager 312 (558), or the constraint server 310 provides the data to the run manager 312 for performing the checking.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method comprising:
   obtaining barcode data on a photoresist bottle in response to initiating a photoresist bottle switching operation by an operator;
   then obtaining photoresist data relating to the photoresist bottle as indicated by the barcode data of the photoresist bottle, said photoresist data obtained from a database in response to obtaining the barcode data, said database comprising information on a plurality of photoresists associated with respective photoresist bottles and respective barcode data;
   then determining whether the photoresist bottle contains appropriate photoresist based on the photoresist data;
   in response to determining that the photoresist bottle contains appropriate photoresist, storing an expiration date of the photoresist bottle and a batch identifier of the photoresist bottle as indicated by the barcode data of the photoresist bottle in the database; and,
   in response to determining that the photoresist bottle contains inappropriate photoresist, acting to prevent semiconductor processing of semiconductor wafers utilizing the inappropriate photoresist contained in the photoresist bottle.

2. The method of claim 1, wherein initiating the photoresist bottle switching operation by an operator is performed through a graphical user interface.

3. The method of claim 2, wherein initiating the photoresist bottle switching operation by the operator comprises the operator manually causing the barcode data of the photoresist bottle to be obtained through the graphical user interface.

4. The method of claim 1, further comprising automatically initiating the photoresist bottle switching operation including automatically obtaining barcode data from a switched photoresist bottle switched by said photoresist bottle switching operation, said photoresist bottle switching operation initiated upon the operator lifting a previously positioned photoresist bottle for more than a predetermined length of time.

5. The method of claim 4, wherein the predetermined length of time comprises fifteen seconds.

6. The method of claim 1, wherein obtaining the barcode data on the photoresist bottle is performed by an equipment server obtaining the barcode data from a controller.

7. The method of claim 1, wherein obtaining the photoresist data relating to the photoresist bottle is performed by a constraint server obtaining the photoresist data from the database, the constraint server further providing the data to an equipment server.

8. The method of claim 1, wherein determining whether the photoresist bottle contains appropriate photoresist is performed by at least one of a constraint server and an equipment server.

9. The method of claim 1, wherein storing the expiration date of the photoresist bottle and the batch indicator of the photoresist bottle is performed by an equipment server through a constraint server.

10. The method of claim 1, wherein the method is implemented as one or more computer programs.

11. A photoresist software system comprising:
    a database within a computer system, said database adapted to store photoresist operation activity records and information concerning a plurality of photoresists, each photoresist associated with a respective barcode on a respective photoresist container within said database;
    a graphical user interface adapted to initiate photoresist operations including initiating a photoresist container switching operation, activities of which comprise said photoresist operation activity records; and,
    a equipment server within said computer system, said equipment server adapted to process photoresist-related data received from a controller separate from said computer system and to process photoresist-related data stored in the database, said photoresist-related data received in response to initiating a barcode reading operation on a photoresist container, the equipment server adapted to prevent improper photoresist operations from occurring based on said barcode reading operation and receipt of said photoresist-related data from said database, the improper photoresist operations selected from the group consisting of: using an expired photoresist contained in said photoresist container, and using an improper type of photoresist contained in said photoresist container;
    said equipment server programmed to operate as follows:
    in response to determining that said photoresist container contains appropriate photoresist, storing an expiration date of said photoresist container and a batch identifier of said photoresist container as indicated by the barcode data of said photoresist container in the database; and,
    in response to determining that said photoresist container contains inappropriate photoresist, acting to prevent semiconductor processing of semiconductor wafers utilizing the inappropriate photoresist contained in said photoresist container.

12. The system of claim 11, further comprising a constraint server to assist the equipment server in acting to prevent the improper photoresist operations from occurring.

13. The system of claim 12, wherein the constraint server is communicatively coupled between the database and the equipment server, and obtains data from the database for the equipment server.

14. The system of claim 11, further comprising a run manager acting to prevent improper photoresist operations from occurring during receiving of a lot of said photoresist containers.

15. The system of claim 11, further comprising a manufacture execution system to execute operations initiated through the graphical user interface.

16. The system of claim 11, further comprising a report system to provide for querying of the database.

17. A photoresist hardware system comprising:
   a photo track adapted to load and unload photoresist containers;
   a barcode reader adapted to read barcodes of each of the photoresist containers in response to initiating a photoresist container switching operation;
   a container sensor adapted to determine whether the photo track has loaded therein a photoresist container;
   a controller communicating with the barcode reader and the container sensor, said controller adapted to initiate a barcode reading operation on said photoresist container in response to said container sensor, said controller further adapted to retrieve photoresist information concerning a photoresist contained in said photoresist container from a database in response to said barcode reading operation, said database within a computer, said computer separate from said controller, said database comprising information on a plurality of photoresists associated with respective photoresist containers and barcodes including a barcode on said photoresist container; and,
   said computer in communication with said controller, said computer adapted to prevent improper photoresist operations from occurring based on said photoresist information, the improper photoresist operations selected from the group consisting of: using an expired photoresist contained in said photoresist container, and using an improper type of photoresist contained in said photoresist container;
   said computer programmed to operate as follows:
   in response to determining that said photoresist container contains appropriate photoresist, storing an expiration date of said photoresist container and a batch identifier of said photoresist container as indicated by the barcode data of said photoresist container in the database; and,
   in response to determining that said photoresist container contains inappropriate photoresist, acting to prevent semiconductor prodessing of semiconductor wafers utilizing the inappropriate photoresist contained in said photoresist container.

18. The system of claim 17, wherein the computer comprises software running thereon comprising:
   said database adapted to store photoresist operation activity records and photoresist information on a plurality of photoresists associated with respective photoresist containers;
   a graphical user interface adapted to initiate photoresist operations including photoresist container switching operations and barcode reading operations for reading barcodes and retrieving information associated with a particular photoresist container from the database, activities of which comprise said photoresist operation activity records; and,
   an equipment server adapted to process photoresist-related data received from the controller and to process photoresist-related data received from the database including a photoresist type and a photoresist expiration date, the equipment server adapted to prevent the improper photoresist operations from occurring based on said photoresist-related data.

19. The system of claim 18, wherein the software further comprises a constraint server adapted to assist the equipment server in acting to prevent the improper photoresist operations from occurring, wherein the constraint server is communicatively coupled between the database and the equipment server, said constraint server adapted to obtain data from the database for the equipment server.

* * * * *